United States Patent [19]

Bailes

[11] Patent Number: 4,730,620

[45] Date of Patent: Mar. 15, 1988

[54] NUCLEAR MAGNETIC RESONANCE METHOD AND APPARATUS FOR REDUCING MOTION ARTIFACTS

[75] Inventor: David R. Bailes, London, England

[73] Assignee: Picker International, Ltd., Wembley, England

[21] Appl. No.: 75,668

[22] Filed: Jul. 20, 1987

Related U.S. Application Data

[63] Continuation-in-part of Ser. No. 751,186, Jul. 2, 1985, abandoned.

[30] Foreign Application Priority Data

Jul. 6, 1984 [GB] United Kingdom ................. 8417290

[51] Int. Cl.$^4$ .............................................. A61B 5/05
[52] U.S. Cl. .................................... 128/653; 128/721; 73/309
[58] Field of Search ...................... 128/653, 721, 722; 324/309

[56] References Cited

U.S. PATENT DOCUMENTS

| | | |
|---|---|---|
| 4,284,950 | 8/1981 | Burl et al. . |
| 4,303,077 | 12/1981 | Lewin et al. . |
| 4,443,760 | 4/1984 | Edelstein et al. .................. 324/309 |
| 4,545,384 | 10/1985 | Kawachi ............................ 128/653 |
| 4,564,017 | 1/1986 | Glover . |
| 4,567,893 | 2/1986 | Charles et al. . |
| 4,581,581 | 4/1986 | Pelc ................................... 324/309 |
| 4,604,578 | 8/1986 | Young . |
| 4,614,195 | 9/1986 | Bottomley et al. ................ 128/653 |
| 4,663,591 | 5/1987 | Pelc et al. ....................... 128/653 X |

FOREIGN PATENT DOCUMENTS

| | | |
|---|---|---|
| 0021535 | 1/1981 | European Pat. Off. ........... 128/653 |
| 0172345 | 6/1985 | European Pat. Off. . |
| 2854774 | 7/1980 | Fed. Rep. of Germany . |
| 2161937A | 7/1981 | United Kingdom . |
| 0096487 | 12/1983 | United Kingdom . |

OTHER PUBLICATIONS

Advertisement *Radiology*, vol. 158, No. 1, Jan. 1986 entitled "Reducing MR Respiratory Motion Artifacts."
Runge, V. M. et al.; "Respiratory Gating in Magnetic Resonance Imaging at 0.5 Tesla", *Radiology*, May 1984, pp. 521–523.
Wood et al.; "MR Image Artifacts from Periodic Motion", *Med. Phys.* 12(2) Mar./Apr. 1985, pp. 143–151.
Vinocur, "Motion Reduction Software Brightens Outlook for Body MRI", Diagnostic Imaging, Aug. 1985, pp. 79–84.
Vinocur, "MR Suppliers' Common Goal: Ghostbusting Techniques", Diagnostic Imaging, Mar. 1986, pp. 109–125.
Z. J. J. Stekly; "Nuclear Magnetic Resonance Imaging", *Electro*, May, 1984, pp. 1–10.

*Primary Examiner*—William E. Kamm
*Assistant Examiner*—Ruth S. Smith
*Attorney, Agent, or Firm*—Timothy B. Gurin

[57] ABSTRACT

A method, and an apparatus for performing the method, are described, for imaging a region of a body using NMR in which part of the region is moving with a motion such that its displacement with respect to time is a nonmonotonic function during the time period over which NMR data signals are collected. The data signals are collected in an order dependent on the motion such that motion artifacts are reduced.

10 Claims, 5 Drawing Figures

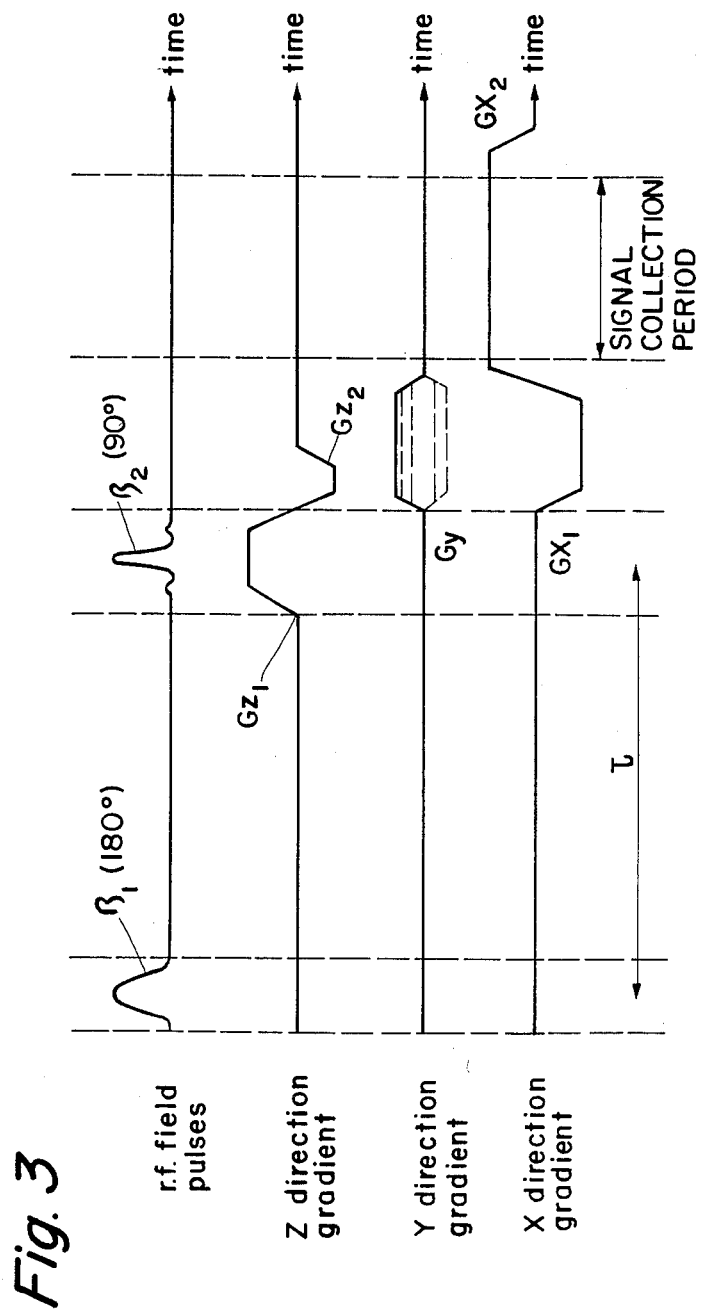

NUCLEAR MAGNETIC RESONANCE METHOD AND APPARATUS FOR REDUCING MOTION ARTIFACTS

This application is a continuation-in-part of application Ser. No. 751,186 filed July 2, 1985 now abandoned.

This invention relates to nuclear magnetic resonance methods and apparatus for imaging a body. In such methods it is often necessary to measure NMR data signals over a period of time which together define an image of a region of the body being imaged. If part of the region is moving during this period, such that its displacement with respect to time is a nonmonotonic function during the period, for example where the region being imaged includes the ribcage of a living person which is moving due to respiratory motion, a number of motion artifacts in the form of one or more ghost images of the moving part of the region are often produced. These ghost images are displaced by various amounts with respect to, and degrade the parts of the image originating from the part of the region which is not moving. One method of reducing such artifacts is to collect data signals only when the moving parts are in a particular position, e.g. during the end expiratory phase of the respiratory cycle. While this method works well, it does lead to an increase in the scan time needed to produce the image.

It is an object of the present invention to provide a nuclear magnetic resonance method for imaging a region of a body, together with an apparatus for performing the method, wherein such motion artifacts are at least reduced without increasing the necessary scan time.

According to the present invention a nuclear magnetic resonance method for imaging a region of a body in which part of the region is moving with a motion such that its displacement with respect to time is a nonmonotonic function during the time period over which a plurality of NMR data signals which together define an image are collected is characterised in that the data signals are collected in an order dependent on the motion such that motion artifacts are reduced.

The invention also provides a nuclear magnetic resonance apparatus for imaging a region of a body in which part of the region is moving with a motion such that its displacement with respect to time is a nonmonotonic function during the time period over which NMR data signals which together define an image are collected, the apparatus being characterised in that it includes means for collecting the data signals in an order dependent on the motion such that motion artifacts are reduced.

One method of imaging a region of a body using NMR techniques in accordance with the invention will now be described, by way of example only, together with apparatus for performing the method, with reference to the accompanying drawings in which:

FIG. 3 illustrates the magnetic field sequence employed in the method;

The apparatus is for the most part of conventional form, for example, as described in U.S. Pat. Nos. 4,284,948 and 4,355,282.

The basic elements of such an apparatus are as follows:

The apparatus includes a first coil system whereby a magnetic field can be applied to a body to be examined in a given direction, normally designated the Z-direction, with a gradient in any one or more of the three orthogonal directions, i.e. X, Y and Z directions.

Figure 1:
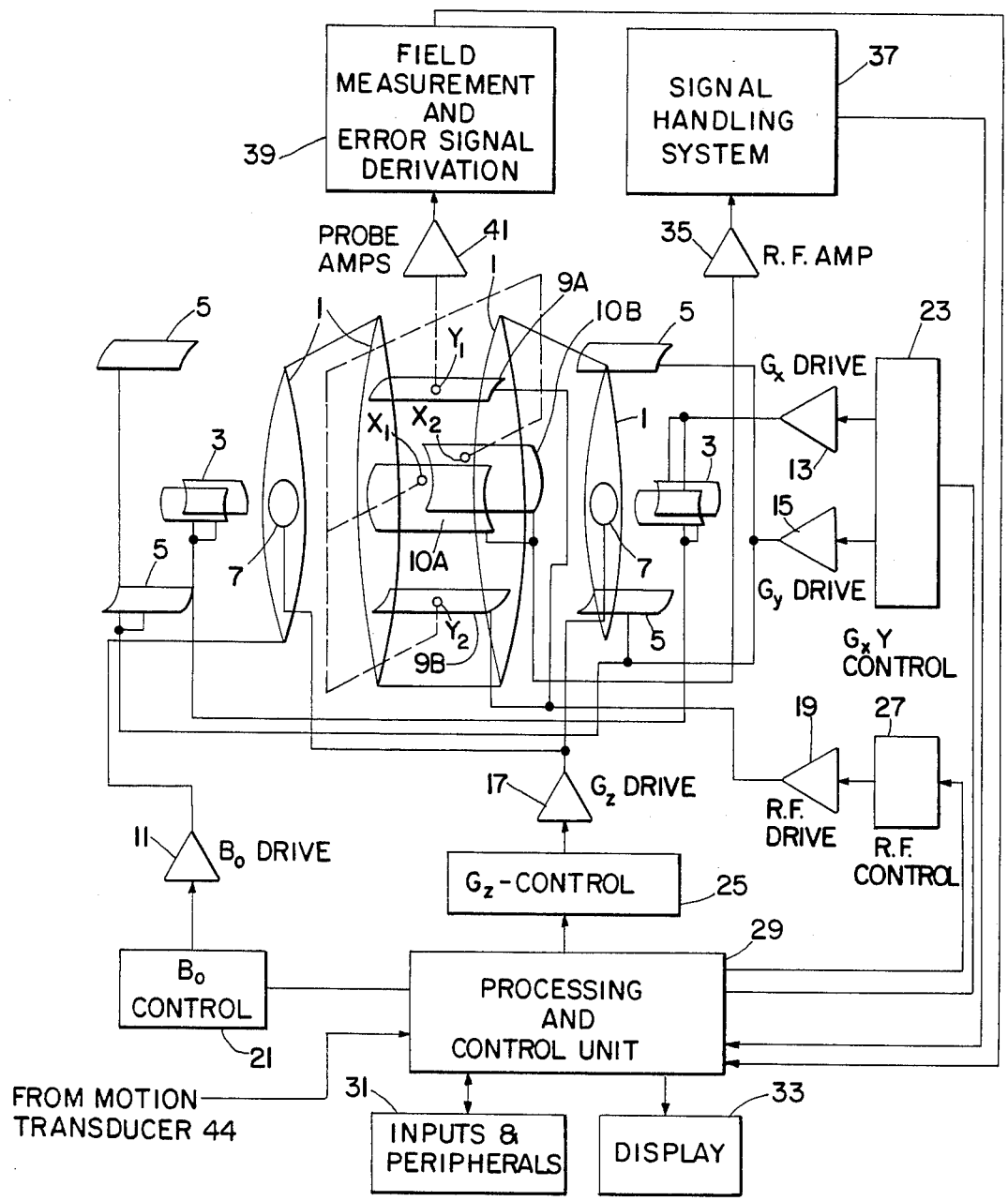
FIGS. 1 and 2 illustrate the apparatus diagrammatically.

Referring to FIG. 1, the first coil system comprises coils 1 which provide a steady uniform magnetic field Bo in the Z-direction; coils 3 which provide a magnetic field gradient Gx in the X-direction, coils 5 which provide a magnetic field gradient Gy in the Y-direction; and coils 7 which provide a magnetic field gradient Gz in the Z-direction.

In addition, the apparatus includes a second coil system whereby RF magnetic fields can be applied to the body under examination in a plane normal to the direction of the magnetic field produced by the first coil system, and whereby RF magnetic fields resulting from nuclei in the body under examination which have been excited to neclear magnetic resonance with a spin vector component other than in the Z-direction can be detected.

The second coil system comprises a first coil arrangement comprising a pair of coils 9A and 9B for applying RF fields, and a second coil arrangement comprising coils 10A and 10B for detecting RF fields.

The various coils 1, 3, 5, 7 and 9A and 9B are driven by Bo, Gx, Gy, Gz and RF drive amplifiers 11, 13, 15, 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 10A and 10B are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that while shown separately to clarify the present description, the signal handling system 37 may conveniently form part of the unit 29.

Figure 2:
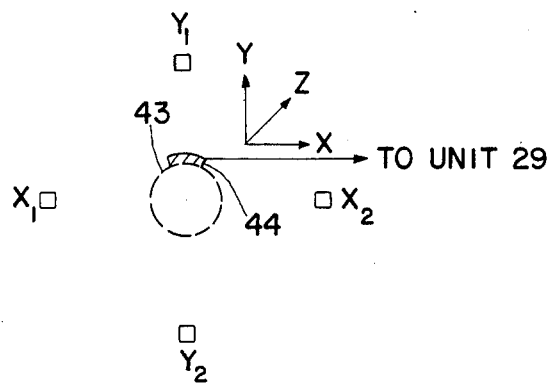

The apparatus also includes field measurement and error signal circuits 39 which receive signals via amplifiers 41 from field probes $X_1$, $X_2$, $Y_1$, and $Y_2$ which are disposed at suitable positions in relation to the body 43 being examined, as illustrated in FIG. 2, to monitor the applied magnetic fields.

Referring now to FIG. 3, the method to be described is a development of the well known inversion recovery sequence using phase-frequency encoding. A steady homogeneous magnetic field is applied to the body under examination in the Z direction. This field serves to define the equilibrium axis of magnetic alignment of the nuclei in the body, i.e. along the +Z direction, and remains constant throughout the procedure. A radio frequency field pulse, denoted $B_1$ (180°) for reasons described hereafter is then applied to the body. The frequency of this field is chosen to be the Larmor frequency for hydrogen nuclei, i.e. protons in the body in the homogeneous magnetic field. The integral of the pulse is such that the pulse is just sufficient to rotate the spins of the protons through an angle of 180°, and is thus referred to as a 180° pulse, the spins thus being rotated from the $+Z$ direction to the $-Z$ direction. A time $\tau$ is then allowed to elapse during which period the rotated spins will tend to relax back to their equilibrium alignment along the $+Z$ direction, and then a second radio frequency field pulse, $B_2(90°)$ is applied together with a magnetic field along the Z direction $Gz_1$. This field pulse $B_2(90°)$ is again chosen to be at the Larmor frequency for the protons in the body to preferentially rotate the proton spins in a slice of the body normal to the Z direction defined by the magnetic field along the Z direction, the gradient $Gz_1$ being centered about this slice. The integral of the pulse $B_2(90°)$ is chosen to be sufficient to rotate the spins through an angle of 90° from their equilibrium axis of magnetic alignment, such that the spins of the protons within the slice will then precess in the X-Y plane about the Z direction at the Larmor frequency. As however some of these spins have originated from the $-Z$ direction, while others have had time to relax back to the $+Z$ direction before application of the $B_2(90°)$ pulse, the free induction decay signal originating from these spins will then be indicative of the $T_1$ values of the material in the slice.

The gradient $Gz_1$ is then removed, and replaced by a gradient in the opposite sense $Gz_2$. This causes the rephasing of the spins which have been selectively excited by the combination of the homogeneous magnetic field, the gradient $Gz_1$, and the radio frequency field pulse $B_2(90°)$, the dephasing having been caused by the gradient. During the $Gx_2$ gradient the free induction decay signals originating from the spins of the protons within the slice which are now processing about the X axis within the X-Y plane are measured.

In the magnetic field sequence described herebefore the gradient $Gx_2$ applied during the signal collection period serves to cause a frequency dispersion in the X direction in the slice of the signals originating from the protons within the slice. Thus the slice is effectively divided into a series of columns parallel to the Y direction with the protons within each column producing free induction decay signals of different frequencies from the protons within other columns, these signals thus being distinguishable in the measured signal. The $Gx_1$ gradient applied before the signal collection period allows both negative and positive spatial frequencies to be measured. The effect of the Gy gradient applied before the signal collection period is to cause a phase dispersion along the Y direction of the spins precessing in the XY plane such that the measured signal will vary in phase and amplitude dependent on the magnitude of the phase dispersion along each column.

A time period $\tau$ is allowed to elapse to allow the spins to relax back to their equilibrium axis of magnetic alignment, and then the whole magnetic field sequence as described herebefore is repeated $N_L$ times, where $N_L$ is, for example, 256, with different time integrals of the phase encoding gradient Gy within each sequence. By analysing the $N_L$ sets of measured signals, a two dimensional image of the slice may be reconstructed by taking the two-dimensional Fourier Transform of the two dimensional matrix of data signals. The time integrals of the phase encoding gradients Gy are given by $$\int Gy(t)dt = \Delta g (N-1-N_L/2)$$

where N is the number of the phase encoding gradient at the time $\tau$ and varies from 1 to $N_L$, and $\Delta g$ is a constant.

Figure 4:
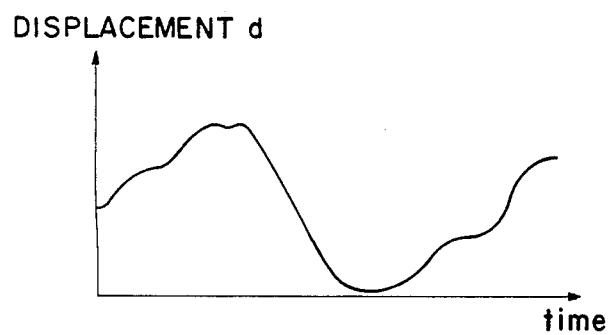
FIG. 4 is a graph of the displacement of a point in the region along a chosen direction as a function of time.

Normally the value of N is stepped through consecutive values for consecutive magnetic field sequences. While this is suitable for the imaging of a stationary body, where part of the slice is moving with a periodic motion along the Y direction, for example where the slice is a slice including the rib cage of a respiring person, due to the periodicity of the movement, motion artifacts of the moving part will be produced in the reconstructed image along the Y direction, the signal collection period being sufficiently short compared to the period of the movement such that motion artifacts are not produced in the X direction. This may be explained by considering a stationary point monitored by the r.f. coils 10A and 10B through which the moving part of the slice passes. Where the value of the time integral of the phase encoding gradient pulse is stepped through consecutive values for consecutive r.f. pulse sequences, the magnetisation measured at the point will acquire a periodic component due to the periodic movement of the part of the slice through the point, which component will give rise to the motion artifacts. In the method in accordance with the invention a movement transducer 44 is attached at a suitable position on the person which is moving in phase with the moving part of the selected slice and the displacement d of a point on the person along the Y direction as a function of time during the respiratory cycle is recorded as indicated in FIG. 4. From this displacement/time graph, the probability distribution of the displacement may be calculated, and from this distribution a look-up table may be programmed into the unit 29 of the form shown in FIG. 5. In this table the possible values of the displacement d are digitised into 256 units, and for each unit a value of N is allocated such that the variation of d with the time integral of the phase encoding gradient and thus N is the best possible approximation to a monotonic function. The values of N in the look-up table are allocated such that the rate of change of the values of N with displacement d varies with displacement probability. Within each magnetic field sequence, just before the application of the phase encoding gradient Gy, the displacement d of the monitored point on the person is measured, and from this value of d the appropriate value of N is determined from the look-up table. If, it is found that a phase encoding gradient using the particular value of N has already been applied, the nearest value of N which has not already been used is selected instead, such that after 256 sequences all values of N have been used.

Thus, again considering a stationary point monitored by the r.f. coils 10A and 10B, through which the moving part of the slice passes, as the displacement of the moving slice is a monotonic function of the time integral of the phase encoding gradient pulse, the magnetisation measured at the point will be a slowly varying function of the time integral of the phase encoding gradient pulses. By this method it is found that motion artifacts of the moving parts in the reconstructed image are reduced leaving an image of the stationary part of the slice together with a smeared image of the moving part.

It will be appreciated that while the method described herebefore by way of example is a development of an inversion recovery sequence using phase frequency encoding, the invention is equally applicable to other excitation pulse sequences and imaging methods, for example reconstruction from projections imaging methods.

Figure 5:
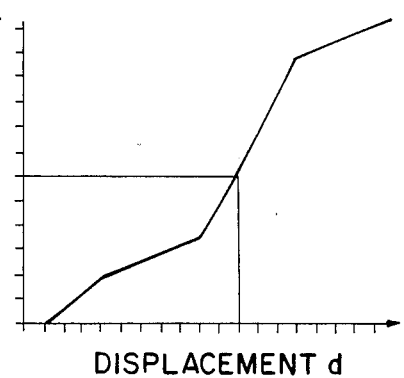
FIG. 5 is a graph illustrating the contents of a 'look-up table' for use in the method.

In the case of a reconstruction from projections imaging method a frequency encoding magnetic gradient field is used to define a series of parallel strips across a chosen slice of a body being imaged, the strips being caused to rotate across the slice in successive scans by variation of the direction of the gradient field, a respective data signal being obtained from the strips for each orientation of the strips on the slice. While usually the angle $\theta$ which the strips make with an initial direction across the slice is stepped through consecutive values for consecutive r.f. pulse sequences, in one example of such a method in accordance with the invention a look up table of the form indicated in FIG. 5 is produced, with the values of N replaced by values of $\theta$, such that the strips are selected in such an order as to cause the relationship between the displacement of a moving part of the body, and the value of $\theta$ to tend towards a monotonic function.

It will also be appreciated that while in the method described herebefore by way of example gradient magnetic fields are used to enable NMR data signals originating from different locations within the region of the body being imaged to be identified, the invention is also applicable to methods and apparatus in which the identification is performed by means of tailored excitation pulses.

I claim:

1. A nuclear magnetic resonance method for imaging a region of a body in which part of the region is moving with a motion such that its displacement with respect to time is a nonmonotonic function during a time period over which a plurality of NMR data signals, which together define an image are collected comprising the step of collecting the data signals in an order dependent on the motion such that motion artifacts are reduced.

2. A method according to claim 1 in which pulses of a phase encoding magnetic gradient field are applied with a respective NMR data signal being collected after each pulse, the pulses being applied in such an order as to cause the relationship between the displacement of the moving part of the region for any one data signal collection and the value of a time integral of the pulse for that data signal collection to tend toward a predetermined function.

3. A method according to claim 2 in which the predetermined function is a monotonic function.

4. A method according to claim 1 in which a frequency encoding magnetic gradient field is used to define a plurality of parallel strips extending across the region and an NMR data signal is collected from the strips, the strips being caused to rotate in the region for successive data collection periods by variation of the direction of the field, such that the relationship between an angle which the strips make with an initial direction across the region for any one data collection period and the displacement of the part of the region for that data collection period tends toward a predetermined function.

5. A method according to claim 4 in which the predetermined function is a monotonic function.

6. A method according to claim 1 in which a probability distribution of the displacement of the region is calculated and used to allocate a respective NMR data signal to each value of displacement.

7. A nuclear magnetic resonance apparatus for imaging a region of a body in which part of the region is moving with a motion such that its displacement with respect to time is a nonmonotonic function during a time period over which a plurality of NMR data signals, which together define an image, are collected, the apparatus comprising: excitation means arranged to excite nuclear magnetic spins preferentially in said region; encoding means arranged to encode said magnetic spins; data collection means arranged to collect data signals representative of encoded magnetic spins; display means responsive to a plurality of collected data signals to display an image of said region; measuring means arranged to produce an output indicative of the displacement of said moving part of said region; and control means for controlling the encoding means during said time period in dependence on the output of said measuring means so that data signals collected during said time period are collected in an order dependent on said motion such that motion artifacts are reduced.

8. An apparatus according to claim 7 wherein said encoding means comprises means for applying phase encoding magnetic gradient pulses to said region; and said control means controls said encoding means so that the data signals are collected in an order such that the relationship between the displacement of said moving part of said region for any one data signal collection and the value of a time integral of the phase encoding gradient pulse for that data signal collection tends toward a predetermined function.

9. An apparatus according to claim 7 wherein said encoding means comprises means for applying a frequency encoding magnetic gradient field effective to define a plurality of parallel strips extending across said region and means for varying the direction of said gradient field so as to cause the strips to rotate in the region for successive data collection periods, and said control means controls the encoding means so that the relationship between an angle which the strips make with an initial direction across the region for any one data collection period and the displacement of said moving part of said region for that data collection period tends toward a predetermined function.

10. An apparatus according to claim 7 wherein said control means includes: means for calculating a probability distribution of the displacement of said moving part of said region, and means for using said probability distribution to allocate a respective data signal collection for each value of displacement.

* * * * *